「12」 United States Patent
Koenigsmann et al.

US006478895B1

(10) Patent No.: US 6,478,895 B1
(45) Date of Patent: Nov. 12, 2002

(54) NICKEL-TITANIUM SPUTTER TARGET ALLOY

(75) Inventors: Holger J. Koenigsmann, Congers; Paul S. Gilman, Suffern; Thomas J. Hunt, Peekskill, all of NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 1 day.

(21) Appl. No.: 09/841,625

(22) Filed: Apr. 25, 2001

(51) Int. Cl.[7] .......................... C22C 19/03; C23C 14/14
(52) U.S. Cl. .................. 148/426; 148/409; 148/556; 420/441; 204/298.13
(58) Field of Search .................. 204/298.13; 148/426, 148/676, 677, 409, 556; 420/441

(56) References Cited

U.S. PATENT DOCUMENTS

| | | | | |
|---|---|---|---|---|
| 3,660,177 A | * | 5/1972 | Brown et al. ............... | 148/677 |
| 4,159,909 A | | 7/1979 | Wilson ........................ | 75/170 |
| 5,316,599 A | * | 5/1994 | Ebato et al. ................. | 148/512 |
| 5,405,646 A | | 4/1995 | Nanis .......................... | 427/131 |

FOREIGN PATENT DOCUMENTS

| | | | | |
|---|---|---|---|---|
| JP | 200096167 | | 4/2000 | |
| JP | 2000-121825 A | * | 4/2000 | ........... C23C/14/14 |
| JP | 2001-011612 A | * | 1/2001 | ........... C23C/14/34 |

* cited by examiner

*Primary Examiner*—Roy King
*Assistant Examiner*—Harry D Wilkins, III
(74) *Attorney, Agent, or Firm*—Blake T. Biederman

(57) ABSTRACT

The sputter target deposits nickel from a binary alloy. The binary alloy contains, by weight percent, 9 to 15 titanium and the balance nickel and incidental impurities. The binary alloy has, by weight percent, 35 to 50 $TiNi_3$ needle-like intermetallic phase and balance α-nickel phase. The $TiNi_3$ needle-like intermetallic phase and α-nickel phase are formed from a eutectic decomposition. The α-nickel phase has a grain size between 50 and 180 $\mu$m. The binary alloy has a Curie temperature of less than or equal to a temperature of 25° C. and exhibits paramagnetic properties at temperatures of 25° C. or lower.

14 Claims, No Drawings

NICKEL-TITANIUM SPUTTER TARGET ALLOY

FIELD OF THE INVENTION

This invention relates to nickel-titanium alloy sputter targets for use with magnetron sputtering systems to deposit nickel.

BACKGROUND OF THE INVENTION

With magnetron sputtering, magnets are located behind the cathode target in a manner as to cause closed magnetic field loops to cut through the cathode. A portion of the magnetic field loop is located adjacent the front face of the cathode. The combination of magnetic field and electric field causes electrons to spiral in long confined paths giving rise to a very dense plasma immediately adjacent to the face of the target material. This dense plasma facilitates an increased yield of material sputtered from the target.

One limitation to magnetron sputtering, however, is that this technique is not amenable to the deposition of ferromagnetic materials. A target of ferromagnetic material acts as a shunt and prevents magnetic field lines from cutting through the target and being located, as required, in front of the target. Therefore, materials such as iron and nickel cannot generally be magnetron sputtered. In order to light and maintain a plasma during the sputtering of ferromagnetic materials, such as pure nickel, it usually is necessary to limit the thickness of the nickel target to usually less than 3 mm. This thin target, however, provides only limited source material and thereby reduces the useful life of the target.

Some limited success in the magnetron sputtering of magnetic nickel has been achieved by using specially fabricated targets in which a thin layer of the ferromagnetic material plates onto a non-ferromagnetic base material. The layer is thin enough so as not to completely shunt the magnetic field, but again, the target is now very expensive and the source has a severely limited lifetime due to the reduced amount of source material.

The Curie temperature varies over a wide range for various materials. By properly forming an alloy of the ferromagnetic nickel with one or more other elements, the Curie temperature can be reduced from that of pure nickel to a temperature lower than the desired sputtering temperature. For example, Nanis, in U.S. Pat. No. 5,405,646, disclose binary systems of platinum, palladium, molybdenum, vanadium, silicon, titanium, chromium, aluminum, antimony, manganese and zinc. Similarly, Wilson, in U.S. Pat. No. 4,159,909, discloses the use of platinum, copper and tin to render nickel paramagnetic at room temperature. As far as known, targets manufactured from these alloys have not received widespread acceptance in the marketplace.

In addition, adding about 7 weight percent vanadium to nickel lowers the Curie temperature for obtaining paramagnetic properties at room temperature. The Curie temperature is the lowest temperature before spontaneous magnetization occurs. The Curie temperature separates the disordered paramagnetic phase from the ordered ferromagnetic phase. Stated in another way, at temperatures below a material's Curie temperature, that material is strongly magnetic or ferromagnetic. For temperatures at and above the Curie temperature, the magnetic properties disappear.

With its shift in Curie temperature, Ni-7 V (wt. %) has become the standard composition for use with direct current magnetron sputtering systems to deposit magnetic nickel. Nickel/vanadium (Ni/V) serves as a barrier/adhesion layer for under-bump metals to support flip chips, or C4 (collapsed, controlled, chip connection) assemblies. The flip chips allow high I/O counts, good speed and electrical performance, thermal management, low profile, and the use of standard surface mount and production lines for assembly. Unfortunately, Ni/V target materials are susceptible to high impurity concentrations and to cracking during fabrication of the target blanks. Moreover, Ni/V films can suffer problems during subsequent etching procedures.

Because magnetic nickel is a highly desirable thin film-for many microcircuit and semiconductor device applications, there is a need to develop a method for sputtering high purity magnetic nickel that does not suffer the above disadvantages.

SUMMARY OF THE INVENTION

The sputter target deposits nickel from a binary alloy. The binary alloy contains, by weight percent, 9 to 15 titanium and the balance nickel and incidental impurities. The binary alloy has, by weight percent, 35 to 50 $TiNi_3$ needle-like intermetallic phase and balance α-nickel phase. The $TiNi_3$ needle-like intermetallic phase and α-nickel phase are formed from a eutectic decomposition. The α-nickel phase has a grain size between 50 and 180 μm. The binary alloy has a Curie temperature of less than or equal to a temperature of 25° C. and exhibits paramagnetic properties at temperatures of 25° C. or lower.

The method forms a binary nickel-titanium sputter target blank by first casting a binary alloy of the above composition into an ingot. The binary alloy has, by weight percent, 35 to 50 $TiNi_3$ intermetallic phase and balance α-nickel phase. Then, dissolving the $TiNi_3$ intermetallic phase into a single α-nickel phase at a temperature of at least 1000° C. prepares the alloy for hot working. Hot working the ingot at a temperature between 1000° C. and the ingot melting temperature forms the target blank, reduces the thickness by at least fifty percent and reduces the α-nickel phase grain size to between 50 and 180 μm. Finally, cooling the target blank precipitates a needle-like $TiNi_3$ intermetallic phase in a α-nickel phase matrix to form the final microstructure.

DETAILED DESCRIPTION

The present invention provides the specific alloying concentration for this binary alloy with a method of preparing targets that facilitates magnetron sputtering of nickel. Magnetron sputtering of nickel can be accomplished by using a binary nickel alloy target material having a properly selected titanium alloying concentration in order that the alloy has a Curie temperature at or below room temperature (25° C.), thereby making the material paramagnetic at room temperature.

A series of incremental tests determined that about 9 weight percent was the minimum amount of titanium necessary to make the alloy paramagnetic at room temperature. For purposes of this specification, all composition's units are expressed in weight percent, unless specifically noted otherwise. This alloy allows the thickness of the target to be increased significantly as compared to a pure nickel target, thereby decreasing the sputtering cost per wafer. With the lower Curie temperature, the alloy is non-ferromagnetic at the sputtering temperature, and is therefore amenable to magnetron sputtering.

Alloying about 9 to 15 weight percent titanium with the balance nickel and incidental impurities produces a sputtering target with paramagnetic properties at room temperature. Advantageously, the alloy contains about 9.5 to 12 weight percent titanium. Most advantageously, the alloy has a nominal composition of about ten weight percent. In addition, advantageously, limiting impurities to less than 0.1 percent provides commercially pure properties. Most advantageously, the target contains less than 0.01 percent impurities.

The melting of the nickel and titanium source material advantageously occurs under a vacuum or protective atmosphere. Most advantageously, a vacuum furnace, such as a semi-continuous vacuum melter (SCVM) can melt the source material in a steel, graphite or ceramic mold. Advantageously, the vacuum is about $1.0 \times 10^{-4}$ mTorr to about 10.0 mTorr.

Advantageously, the binary alloy casting occurs under an atmosphere pressure of less than about 5 mTorr. For example, vacuum atmospheres having a pressure of about 1 mTorr to about 5 mTorr are effective for limiting uncontrolled oxidation of the melt. In addition, pouring into molds having a low pressure protective atmosphere is another procedure for limiting oxidation. To maintain low impurities, it is important to cast the alloy under a controlled atmosphere such as under a protective argon, helium or other Group VIII gas or combination of gases. For example, a low pressure argon atmosphere of about 0.1 to about 0.7 atm, such as about 0.3 atm has been found to provide adequate protection to the melt and the ingot upon pouring.

After the molten alloy is cast into a mold, the alloy cools and solidifies into an "as cast" structure of $TiNi_3$ intermetallic phase and balance α-nickel phase. This as-cast structure is unacceptable for sputtering targets.

To process the alloy, the alloy is first heated for a sufficient period of time and temperature to dissolve the $TiNi_3$ intermetallic phase into an α-nickel phase. If the $TiNi_3$ intermetallic phase remains during deformation, the ingot cracks. Temperatures between about 1000° C. and melting are sufficient to dissolve the intermetallic. Most advantageously, a furnace heats the alloy to a temperature between about 1050 and 1150° C. In addition, the process advantageously heats the ingot for at least one hour and most advantageously at least two hours, to ensure the dissolution of the intermetallic phase.

After dissolving the intermetallic phase, hot working the ingot with at least a fifty percent reduction in thickness breaks the α-nickel grains into a suitable size. Advantageously, hot working occurs at temperatures between about 1000° C. and melting to prevent cracking. Most advantageously, the process hot works the ingot at a temperature between about 1050 and 1150° C.

Advantageously, the hot working consists of hot rolling the ingot into a target blank. Most advantageously, the hot rolling is in a single direction to lower the likelihood of cracking. In addition, maintaining the ingot at a temperature between about 1000° C. and melting during rolling also serves to hold the intermetallic phase in solution and reduce the likelihood of cracking during rolling. Most advantageously, the hot rolling includes reheating between each rolling pass to maintain temperature-during experimentation, reheating between only every other pass resulted in cracking.

Advantageously, the process relies upon multiple passes with each hot rolling pass being less than about 0.05 inch (1.3 mm). For example, multiple passes of about 0.02–0.05 inch (0.5 to 1.3 mm) are effective. Most advantageously, the reduction per pass is between about 0.5 and 1 mm. In addition, having at least ten reduction passes within this range ensures the production of uniform α-nickel grains.

After hot working, cooling the target blank precipitates about 35 to 50 weight percent needle-like $TiNi_3$ intermetallic phase in an α-nickel phase matrix. Advantageously, the alloy contains about 35 to 45 weight percent needle-like $TiNi_3$ intermetallic phase. Most advantageously, the alloy contains about 38 to 42 weight percent needle-like $TiNi_3$ intermetallic phase. The α-nickel phase grain size is between about 50 and 180 μm. Most advantageously, the grain size is between about 70 and 100 μm. In addition to this relatively small grain size, the alloy advantageously contains relatively equi-axed grains of α-nickel phase. Most advantageously, the α-nickel phase has between 10 and 40 percent of each of the following four crystallographic orientations: (111), (200), (220), and (311). After cooling, machining the target blank produces a sputter target having excellent sputtering characteristics.

EXAMPLE

First, vacuum melting 10 weight percent titanium balance nickel at a pressure of 5.0 mTorr in a zirconia crucible purified the alloy. Then casting the melt into a 5.5×15.5×1.5 inch (14×39×3.8 cm) graphite ingot mold produced the binary nickel/titanium alloy target. Pouring in a protective argon atmosphere, at a pressure of 0.3 atm protected the alloy from oxidation.

After solidification and cooling to room temperature, the cast ingot was removed. Then heating the ingot to a temperature of 1100° C. for four hours prepared the ingot for hot rolling. Hot rolling the ingot at a temperature of 1100° C. from 1.5 inch (3.8 cm) thickness down to 0.5 inches (1.3 cm) converted the as cast structure to a grain size of 90 μm. Specifically, rolling the ingot in the short direction with a reduction of 0.04 inches (0.10 cm) per pass formed the target blank. Reheating the ingot to 1100° C. after each pass maintained the intermetallic phase in solution and prevented cracking. The target blank contained 14, 32, 35 and 19 percent of the (111), (200), (220) and (311) crystallographic orientations, respectively. Then machining the rolled blank produced a finished target having a Curie temperature below 25° C.

Sputter targets fabricated from the binary nickel alloys of the present invention have a Curie temperature that is at or below room temperature. The sputter targets of the present invention can be magnetron sputtered at or above room temperature, and the binary alloy exhibits paramagnetic properties at room temperature. Thus, nickel-titanium can be deposited from a sputter target without complete shunting of the magnetic field. The targets of the present invention can be made with greater thicknesses than pure nickel sputter targets, thereby providing a greater target life. Methods for fabricating the binary alloy targets also allow for a crack-free sputter target with a small-uniform grain size to be produced at relatively low cost. While exemplary methods of fabrication have been described for each binary alloy, it should be understood that binary alloy targets of the present invention may be fabricated by other now known or hereafter developed techniques, which are within the ordinary skill of one in the art.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art.

The invention in its broader aspects is therefore not limited to the specific details, representative apparatus and method and illustrative examples shown and described. Accordingly, departures may be made from such details without departing from the scope or spirit of applicants' general inventive concept.

I claim:

1. A sputter target for depositing nickel comprising a binary alloy consisting essentially of, by weight percent, about 9 to 15 titanium and the balance nickel and incidental impurities, the binary alloy having, by weight percent, about 35 to 50 $TiNi_3$ needle-shaped intermetallic phase and balance α-nickel phase, the $TiNi_3$ needle-shaped intermetallic phase and α-nickel phase being formed from a eutectic decomposition, the α-nickel phase having a grain size between about 50 and 180 μm and the binary alloy having a Curie temperature of less than or equal to a temperature of about 25° C. and exhibits paramagnetic properties at temperatures of about 25° C. or lower.

2. The sputter target of claim 1, wherein the binary alloy contains about 9.5 to 12 titanium.

3. The sputter target of claim 1, wherein the α-nickel phase h as a grain size of about 70 to 100 microns.

4. The sputter target of claim 1, wherein the α-nickel phase contains between about 10 and 40 percent of each of the crystallographic orientations (111), (200), (220) and (311).

5. A method of forming a binary nickel-titanium sputter target blank comprising the steps of:

casting a binary alloy into an ingot, the ingot consisting essentially of, by weight percent, about 9 to 15 titanium and the balance nickel and incidental impurities, the binary alloy having, by weight percent about 35 to 50 $TiNi_3$ intermetallic phase and balance α-nickel phase;

dissolving the $TiNi_3$ intermetallic phase into a single α-nickel phase at a temperature of at least about 1000° C.;

hot working the ingot at a temperature between about 1000° C. and the ingot melting temperature to form the target blank, to reduce thickness of the ingot by at least fifty percent and to reduce grain size of the α-nickel phase; and cooling the target blank to precipitate needle-shaped $TiNi_3$ intermetallic phase in an α-nickel phase matrix, the grain size of the α-nickel phase matrix being between about 50 and 180 μm and the binary alloy having a Curie temperature of less than or equal to a temperature of about 25° C. and exhibits paramagnetic properties at temperatures of about 25° C. or lower.

6. The method of claim 5, wherein the nickel and titanium are vacuum melted and cast under an atmosphere pressure of less than or equal to about 5 mTorr.

7. The method of claim 5, wherein hot working occurs at a temperature in the range of about 1050 to 1150° C.

8. A method of forming a binary nickel-titanium sputter target comprising the steps of:

casting a binary alloy into an ingot, the ingot consisting essentially of, by weight percent, about 9 to 15 titanium and the balance nickel and incidental impurities, the binary alloy having, by weight percent, about 35 to 50 $TiNi_3$ intermetallic phase and balance α-nickel phase;

dissolving the $TiNi_3$ intermetallic phase into a single α-nickel phase at a temperature of at least about 1000° C.;

hot rolling the ingot at a temperature between about 1050 and 1150° C. to form the target blank, to reduce thickness of the ingot by at least fifty percent and to reduce grain size of the α-nickel phase grain size;

maintaining temperature of the ingot at a temperature of between about 1050 and 1150° C. during the rolling; and cooling the target blank to precipitate needle-shaped $TiNi_3$ intermetallic phase in an α-nickel phase matrix, the grain size of the α-nickel phase matrix being between about 50 and 180 μm and the binary alloy having a Curie temperature of less than or equal to temperatures of about 25° C. and exhibits paramagnetic properties at temperatures of about 25° C. or lower.

9. The method of claim 8, wherein the nickel and titanium are vacuum melted and cast under an atmosphere pressure of about 5 mTorr or less.

10. The process of claim 8 wherein the hot rolling includes multiple passes of less than about 1.3 mm reduction.

11. The process of claim 10 wherein the reduction per pass is between about 0.5 and 1 mm per pass.

12. The process of claim 10 wherein the maintaining of the temperature consists of reheating the ingot to the temperature between about 1050 and 1150° C. before each hot rolling pass.

13. The method of claim 8 wherein the hot rolling occurs in a single direction.

14. The method of claim 8 including the additional step of machining the target blank to produce a sputter target.

* * * * *